(12) United States Patent
Tu et al.

(10) Patent No.: US 7,682,955 B1
(45) Date of Patent: Mar. 23, 2010

(54) METHOD FOR FORMING DEEP WELL OF POWER DEVICE

(75) Inventors: Shanghui L. Tu, Tainan (TW); Hung-Shern Tsai, Tainan (TW); Jui-Chun Chang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 12/323,411

(22) Filed: Nov. 25, 2008

(30) Foreign Application Priority Data

Oct. 3, 2008 (TW) .............................. 97138162 A

(51) Int. Cl.
*H01L 21/265* (2006.01)
(52) U.S. Cl. ...................... 438/530; 438/519; 438/522; 438/527; 257/E21.346
(58) Field of Classification Search ................. 438/519, 438/522, 527, 530
See application file for complete search history.

(56) References Cited

U.S. PATENT DOCUMENTS

| 6,271,105 B1 * | 8/2001 | Kwon et al. ................. 438/524 |
| 2007/0069309 A1 * | 3/2007 | Lindsay et al. .............. 257/408 |

* cited by examiner

*Primary Examiner*—Alexander G Ghyka
(74) *Attorney, Agent, or Firm*—Quintero Law Office

(57) ABSTRACT

The invention provides a method for forming a deep well region of a power device, including: providing a substrate with a first sacrificial layer thereon; forming a first patterned mask layer on the first sacrificial layer exposing a first open region; performing a first doping process to the first open region to form a first sub-doped region; removing the first patterned mask layer and the first sacrificial layer; forming an epitaxial layer on the substrate; forming a second sacrificial layer on the epitaxial layer; forming a second patterned mask layer on the second sacrificial layer exposing a second open region; performing a second doping process to the second open region to form a second sub-doped region; removing the second patterned mask layer; performing an annealing process to make the first and the second sub-doped regions form a deep well region; and removing the second sacrificial layer.

15 Claims, 5 Drawing Sheets

METHOD FOR FORMING DEEP WELL OF POWER DEVICE

CROSS REFERENCE TO RELATED APPLICATIONS

This Application claims priority of Taiwan Patent Application No. 097138162, filed on Oct. 3, 2008, the entirety of which is incorporated by reference herein.

BACKGROUND OF THE INVENTION

1. Field of the Invention

The present invention relates to a method for forming a deep well, and in particular relates to a method for forming a deep well region of a high power device.

2. Description of the Related Art

Traditional high power devices are provided with vertical double diffused MOSFETs (VDMOSFETs) and lateral double diffused MOSFETs (LDMOSFETs), wherein a double diffused MOSFET is representative of a lateral structure and a trench power transistor is representative of a vertical structure.

For forming a high power tolerance laterally diffused metal oxide semiconductor, usually an n-type drift region with low concentration is used to form a high power tolerance structure, and techniques, such as reduce surface field (RESURF) and field-plate are used to perform an optimum adjustments. For forming a high power device (voltage tolerance 300-1000 V), an n-type deep well region with low concentration is usually used for forming a high power tolerance structure. The processes for forming a traditional n-type deep well region are as shown in FIGS. 1A-1D.

As FIG. 1A shows, a substrate 101 is provided and the substrate 101 has a sacrificial layer 103 thereon. Next, FIG. 1B shows a mask layer formed on the sacrificial layer 103, exposing an open region 107, wherein ion doping is performed to the open region 107 to form a doped region 111. FIG. 1C shows that after the patterned mask layer 105 is removed, an annealing process is performed to diffuse the doped region 111 to form a deep well region 113, thus, to complete the process for forming the deep well region.

However, the process mentioned above needs a long period of time for well diffusion to achieve a desired depth. Therefore, a novel process for forming an n-type deep well region of a high power device is needed to reduce time costs of well diffusion.

BRIEF SUMMARY OF THE INVENTION

In order to overcome the disadvantages mentioned above, the embodiments of the invention provide a process for forming a high power deep well region, which can reduce time costs and thermal budget of well diffusion and can simplify the integration of other high power devices which need the epitaxial process.

The invention provides a method for forming a deep well region of a power device, including: providing a substrate with a first sacrificial layer thereon; forming a first patterned mask layer on the first sacrificial layer exposing a first open region; performing a first doping process to the first open region to form a first sub-doped region; removing the first patterned mask layer and the first sacrificial layer; forming an epitaxial layer on the substrate; forming a second sacrificial layer on the epitaxial layer; forming a second patterned mask layer on the second sacrificial layer exposing a second open region; performing a second doping process to the second open region to form a second sub-doped region; removing the second patterned mask layer; performing an annealing process to make the first and the second sub-doped regions form a deep well region; and removing the second sacrificial layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
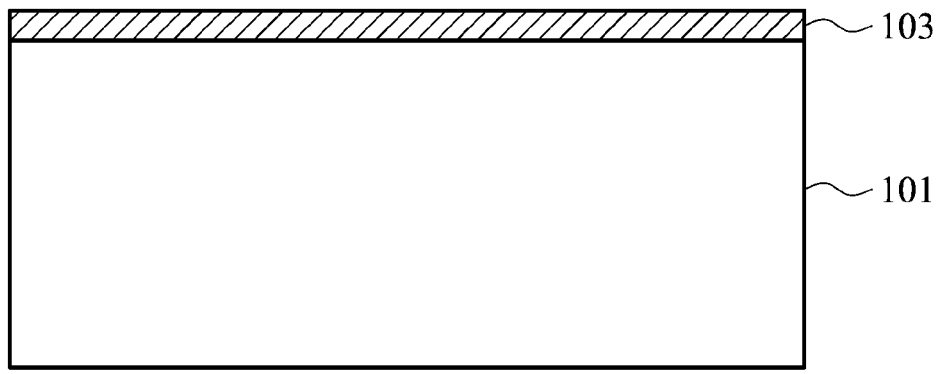
FIGS. 1A-1D show cross-sectional views of the typical process for forming an n-type deep well region.
Figure 1B:
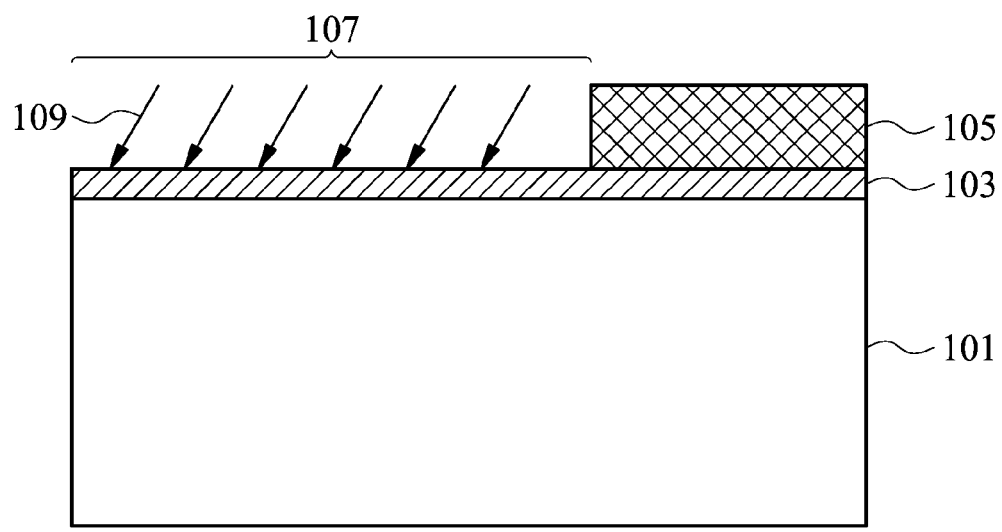
Figure 1C:
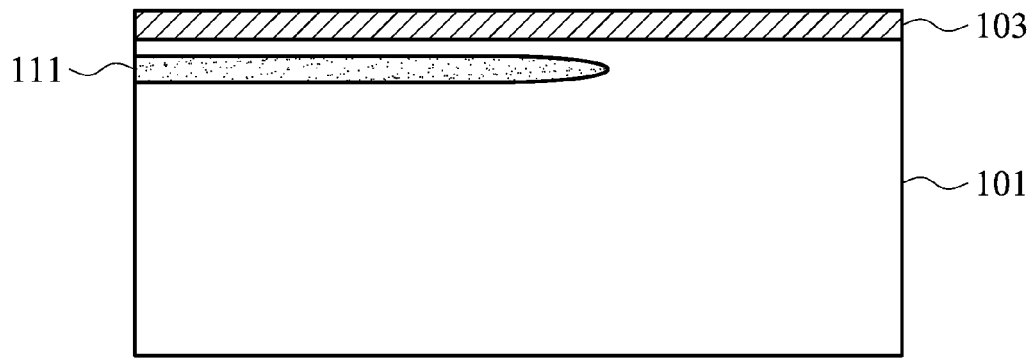
Figure 1D:
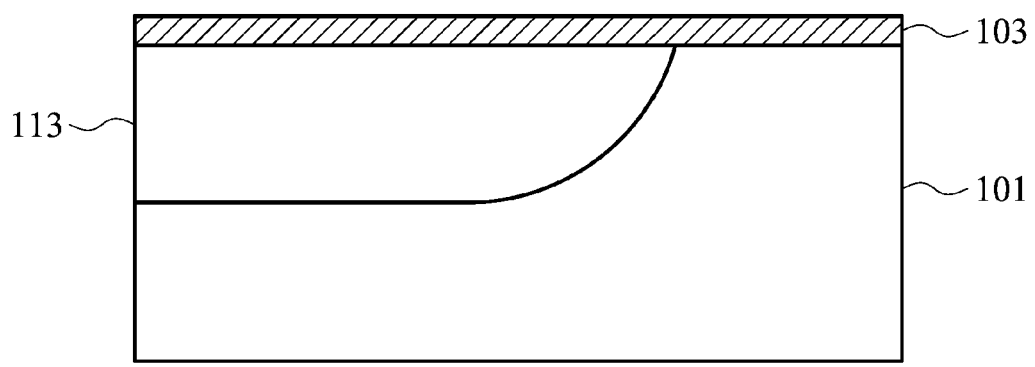

The following description is of the best-contemplated mode of carrying out the invention. This description is made for the purpose of illustrating the general principles of the invention and should not be taken in a limiting sense. The scope of the invention is best determined by reference to the appended claims.

Reference will be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, an apparatus in accordance with the present invention. It is to be understood that elements not specifically shown or described may take various forms well known to those skilled in the art. Further, these are merely examples and are not intended to be limiting.

FIGS. 2A-2F show cross-sectional views of the process for forming a deep well region of a high power device of one embodiment of the invention.

Figure 2A:
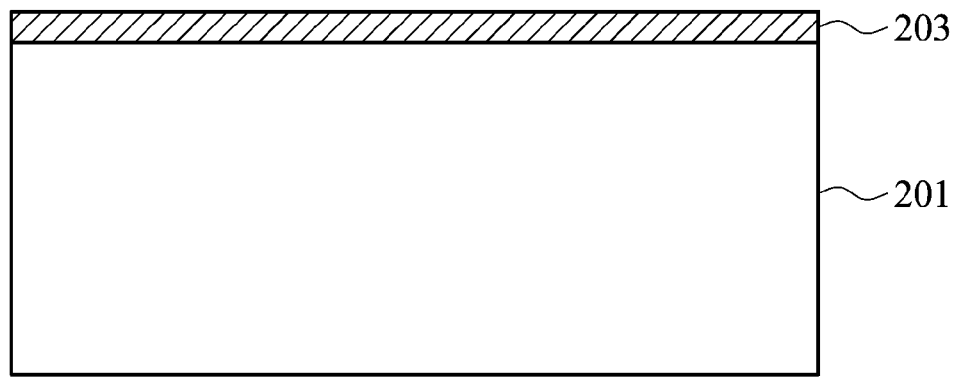
FIGS. 2A-2F show cross-sectional views of the process for forming a deep well region of a high power device of one embodiment of the invention.

As FIG. 2A shows, a substrate 201 is provided and the substrate 201 has a first sacrificial layer 203 thereon. The substrate 201 may comprise a semiconductor substrate, such as a p-type silicon substrate or silicon on insulator (SOI) substrate. The first sacrificial layer 203 may comprise an oxide layer.

Figure 2B:
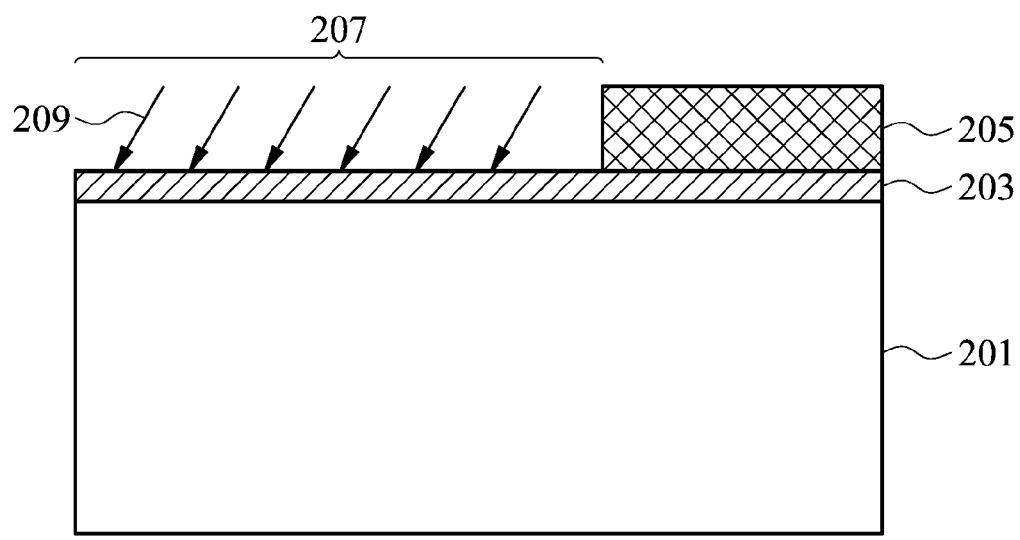

Next, as FIG. 2B shows, a first patterned mask layer 205 is formed on the first sacrificial layer 203 and exposes a first open region 207. The first patterned mask layer 205 may comprise a photoresist layer. In one embodiment, a method for forming the first patterned mask layer 205 may comprise forming a first photoresist layer on the first sacrificial layer 203 and then performing a first lithography process to pattern the first photoresist layer form the first open region 207.

Detailed steps may comprise applying a first photoresist layer on the substrate 201 and then providing a first mask having an opaque area and a transparent area. Light is then made to pass through the first mask to perform an exposure process to transfer a pattern on the first mask onto the first photoresist layer on the substrate 201. After that, a development process is performed and a portion of the first photoresist layer which is not covered by the opaque area is removed to form a first patterned photoresist layer 205 and the first patterned photoresist layer 205 is used to define a predetermined area of the first sub-doped region 221 (FIG. 2C), i.e. the first open region 207.

Figure 2C:
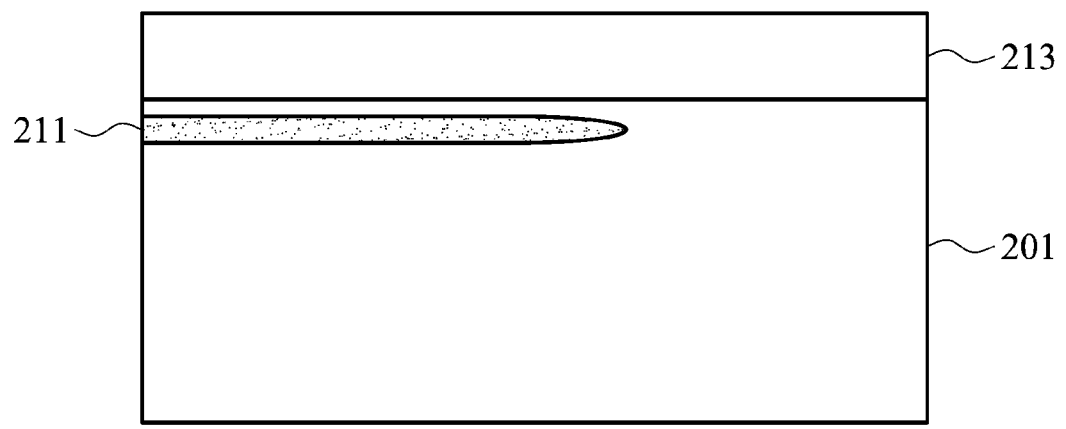

After the first patterned mask layer 205 is formed, a first ion doping process 209 to the first open region 207 is performed to form the first sub-doped region 207 (FIG. 2C). In one embodiment, the first ion doping process 209 may comprise an n-type ion doping process, such as a phosphorous or arsenic n-type ion doping process.

Because ion doping is only to implant particles with energy into the substrate 201, the first sacrificial layer 203 is used to prevent damage to the surface of the substrate 201 which may result from the ion implantation. Note that the first sacrificial layer 203 is later removed from the completed device.

As FIG. 2C shows, next, the first patterned mask layer 205 and the first sacrificial layer 203 are removed, wherein the removing method may comprise a typical removing process, such as a dry etching or wet etching process. After removing the first patterned mask layer 205 and the first sacrificial layer 203, an epitaxial layer 213 is formed on the substrate 201. In one embodiment, a chemical vapor deposition (CVD) process may be used to form the epitaxial layer 213. The epitaxial layer 213 may reduce time costs for the later diffusion of the well region. A material of the epitaxial layer 213 may be the same as the substrate 201, such as a p-type silicon epitaxial layer.

Figure 2D:
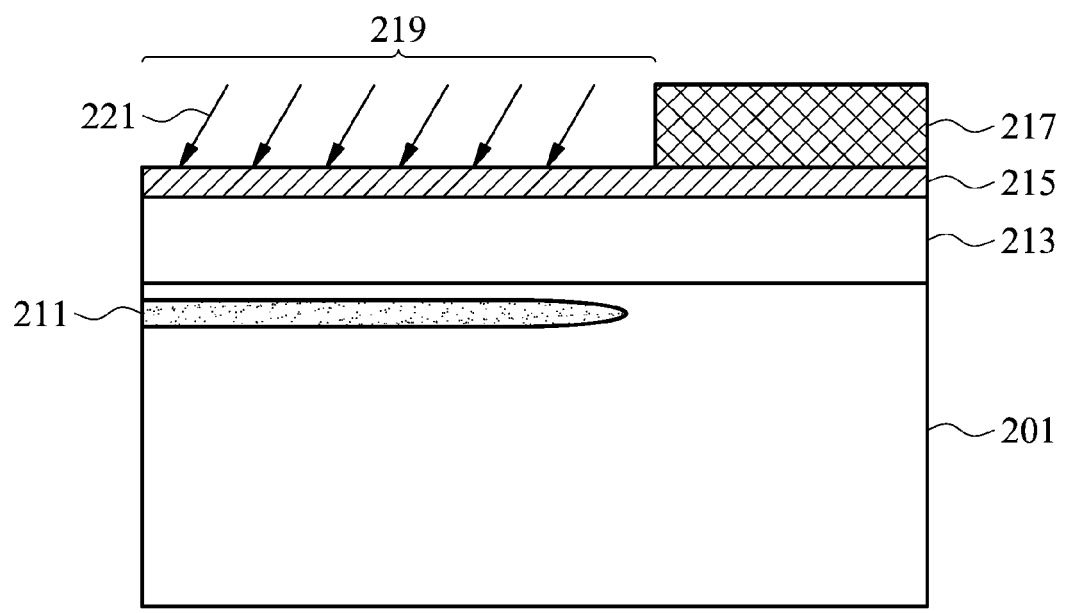

For the next steps, see FIG. 2D. A second sacrificial layer 215 is formed on the epitaxial layer 213, and then a second patterned mask layer 217 is formed on the second sacrificial layer 215 and exposes a second open region 219. The second patterned mask layer 217 may comprise a photoresist layer. In one embodiment, a method for forming the second patterned mask layer 217 may comprise forming a second photoresist layer on the second sacrificial layer 215 and then performing a second lithography process to pattern the second photoresist layer form the second open region 219.

Detailed steps may comprise applying a second photoresist layer on the second sacrificial layer 215 and then providing a second mask having an opaque area and a transparent area. Light is then made to pass through the second mask to perform an exposure process to transfer a pattern on the second mask onto the second photoresist layer on the second sacrificial layer 215. After that, a development process is performed and a portion of the second photoresist layer, which is not covered by the opaque area, is removed to form a second patterned photoresist layer 217 and the second patterned photoresist layer 217 is used to define a predetermined area of the a second sub-doped region 223 (FIG. 2E), i.e. the second open region 219.

Figure 2E:
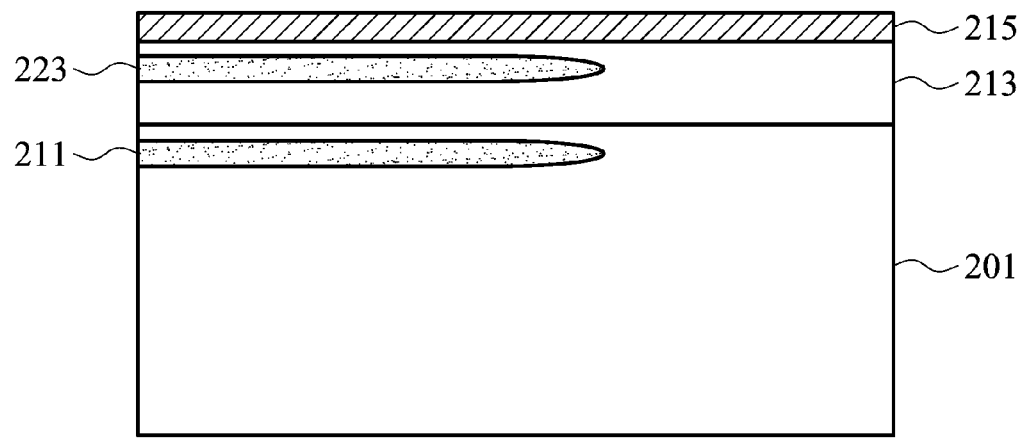

After the second patterned mask layer 217 is formed, a second ion doping process 221 to the second open region 219 is performed to form the second sub-doped region 223 (FIG. 2E). In one embodiment, the second ion doping process 221 may comprise an n-type ion doping process, such as a phosphorous or arsenic n-type ion doping process.

Because ion doping is only to implant particles with energy into the epitaxial layer 213, the second sacrificial layer 215 is used to prevent damage to the surface of the epitaxial layer 213 which may result from the ion implantation. Note that the second sacrificial layer 215 is later removed from the completed device.

In one embodiment, a concentration of the first ion doping process and a concentration of the second ion doping process may be the same. In other embodiment, a concentration of the first ion doping process and a concentration of the second ion doping process may be different.

For the next steps, see FIG. 2E. The second patterned mask layer is removed and the removing method may comprise a typical removing process, such as a dry etching or wet etching process. Then, an annealing process is performed to diffuse the first-sub doped region 211 and the second-sub doped region 223 to form a deep well region 225.

It is noted that the first and second open regions are at the same position and both are corresponding to the deep well region 225. The first mask and second mask may be the same mask.

Figure 2F:
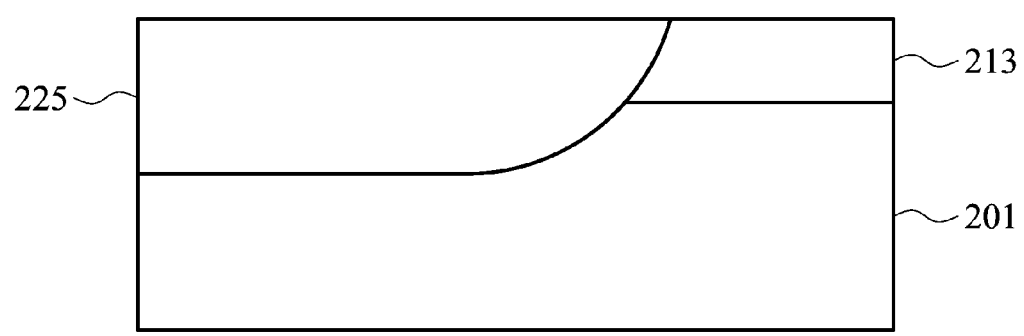

Finally, as FIG. 2F shows, the second sacrificial layer 215 is removed from the epitaxial layer 213 to complete the process for forming a high power deep well region of the embodiment of the invention. Note that the presence of the epitaxial layer 213 may reduce time costs for diffusion of the well region and is applicable to form a high power deep well region of a high power device of the invention.

The process for forming a high power deep well region mentioned above may be applied to the processes for any kind of high power device, such as a laterally diffused metal oxide semiconductor.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a deep well region of a power device, comprising:
   providing a substrate with a first sacrificial layer thereon;
   forming a first patterned mask layer on the first sacrificial layer exposing a first open region;
   performing a first doping process to the first open region to form a first sub-doped region;
   removing the first patterned mask layer and the first sacrificial layer;
   forming an epitaxial layer on the substrate;
   forming a second sacrificial layer on the epitaxial layer;
   forming a second patterned mask layer on the second sacrificial layer exposing a second open region;
   performing a second doping process to the second open region to form a second sub-doped region;
   removing the second patterned mask layer;
   performing an annealing process to make the first and the second sub-doped regions form a deep well region; and
   removing the second sacrificial layer.

2. The method for forming a deep well region of a power device as claimed in claim 1, wherein the substrate comprises a p-type silicon substrate or a silicon on insulator substrate.

3. The method for forming a deep well region of a power device as claimed in claim 1, wherein the first sacrificial layer comprises an oxide layer.

4. The method for forming a deep well region of a power device as claimed in claim 1, wherein the first and second open regions correspond to the deep well region.

5. The method for forming a deep well region of a power device as claimed in claim 1, wherein the first patterned mask layer comprises a photoresist layer.

6. The method for forming a deep well region of a power device as claimed in claim 1, wherein a step for forming the first patterned mask layer comprises:
   forming a first photoresist layer on the first sacrificial layer; and performing a first lithography process to make the first photoresist layer form the first open region.

7. The method for forming a deep well region of a power device as claimed in claim 1, wherein the first doping process and second doping process are n-type ion doping processes.

8. The method for forming a deep well region of a power device as claimed in claim 7, wherein the n-type ion is a phosphorous or arsenic n-type ion.

9. The method for forming a deep well region of a power device as claimed in claim 1, wherein a concentration of the first doping process and a concentration of the second doping process are the same.

10. The method for forming a deep well region of a power device as claimed in claim 1, wherein a concentration of the first doping process and a concentration the second doping process are different.

11. The method for forming a deep well region of a power device as claimed in claim 1, wherein a material of the epitaxial layer is the same as the substrate.

12. The method for forming a deep well region of a power device as claimed in claim 1, wherein a material of the epitaxial layer comprises a p-type epitaxial layer.

13. The method for forming a deep well region of a power device as claimed in claim 1, wherein the second sacrificial layer comprises an oxide layer.

14. The method for forming a deep well region of a power device as claimed in claim 1, wherein the second patterned mask layer comprises a photoresist layer.

15. The method for forming a deep well region of a power device as claimed in claim 1, wherein a step for forming the first patterned mask layer comprises:

forming a second photoresist layer on the first sacrificial layer; and performing a second lithography process to make the second photoresist layer form the second open region.

* * * * *